(12) United States Patent
Campi, Jr. et al.

(10) Patent No.: US 8,377,754 B1
(45) Date of Patent: Feb. 19, 2013

(54) STRESS ENHANCED JUNCTION ENGINEERING FOR LATCHUP SCR

(75) Inventors: John B. Campi, Jr., Westford, VT (US); Robert J. Gauthier, Jr., Hinesburg, VT (US); Junjun Li, Williston, VT (US); Rahul Mishra, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/269,819

(22) Filed: Oct. 10, 2011

(51) Int. Cl.
 *H01L 21/332* (2006.01)

(52) U.S. Cl. ............... 438/133; 257/E29.181; 257/107; 438/140

(58) Field of Classification Search ............... 438/133, 438/140; 257/107, E29.181
See application file for complete search history.

(56) References Cited

U.S. PATENT DOCUMENTS

| | | | |
|---|---|---|---|
| 6,016,002 | A | 1/2000 | Chen et al. |
| 6,194,764 | B1 | 2/2001 | Gossner et al. |
| 6,753,232 | B2 | 6/2004 | Kwak et al. |
| 6,768,619 | B2 | 7/2004 | Ker et al. |
| 7,355,214 | B2 | 4/2008 | Noguchi et al. |
| 7,589,359 | B1 * | 9/2009 | Hwang ............... 257/107 |
| 2004/0016992 | A1 | 1/2004 | Mallikarjunaswamy |
| 2007/0057320 | A1 | 3/2007 | Ueno et al. |
| 2009/0067105 | A1 | 3/2009 | Lin et al. |
| 2010/0133612 | A1 | 6/2010 | Sandhu et al. |

* cited by examiner

*Primary Examiner* — Asok K Sarkar
(74) *Attorney, Agent, or Firm* — Cantor Colburn LLP; Michael LeStrange

(57) ABSTRACT

A method of forming an IC device including a latchup silicon controlled rectifier (SCR) includes forming a mask on a top surface of a substrate, wherein the mask covers a first portion of the substrate and exposes a second portion of the substrate that is located in one of an n-well and a p-well on the substrate; etching the exposed second portion of the substrate to form an etched area; forming a stress engineered junction of the latchup SCR by selective epitaxial deposition in the etched area; and removing the mask.

20 Claims, 13 Drawing Sheets

STRESS ENHANCED JUNCTION ENGINEERING FOR LATCHUP SCR

BACKGROUND

This disclosure relates generally to the field of semiconductor device fabrication, and more particularly to fabrication of integrated circuits (ICs) including silicon controlled rectifiers (SCRs), also referred to as thyristors.

ICs, including complementary metal-oxide-semiconductor (CMOS) devices, are susceptible to undesired parasitic SCR action known as latchup, which if not controlled can lead to damage to the IC. Latchup describes a type of short circuit that occurs due to the existence within the CMOS circuit of parasitic SCR structures. The parasitic SCR structures comprise PNPN junctions which act as a PNP transistor and an NPN transistor cross coupled to each other. Under certain conditions, such as the presence of a transient signal, one of the PN junctions can be forward biased, which turns on the SCR. The device can remain turned on in a latchup state even after the signal which causes the forward biasing on the PN junction is removed. The two transistors keep each other in saturation for as long as the SCR structure is forward-biased. Reduction of latchup effects is important for improved functioning of ICs.

While some SCRs in an IC may comprise latchup SCRs as described above, other SCRs may be included in an IC to dissipate electrostatic discharge (ESD) events. An ESD event refers to an electrical discharge of a current (positive or negative) for a short duration, during which a large amount of current is provided to the CMOS device. The large current may be built up from a variety of sources, for example, the human body. An ESD event commonly results from the discharge of a high voltage potential (typically, several kilovolts) of a short duration (typically, 100 nanoseconds). An ESD event may be generated by human contact with the leads of an IC of by electrically charged machinery being discharged in other leads of an IC. Such ESD events may destroy an IC if not dissipated safely. An ESD event may be dissipated by an ESD SCR that sustains high currents, holding the voltage across the SCR at a low level. Therefore, ESD SCRs may be included in an IC to bypass high currents associated with an ESD event.

BRIEF SUMMARY

In one aspect, a method of forming an IC device including a latchup silicon controlled rectifier (SCR) includes forming a mask on a top surface of a substrate, wherein the mask covers a first portion of the substrate and exposes a second portion of the substrate that is located in one of an n-well and a p-well on the substrate; etching the exposed second portion of the substrate to form an etched area; forming a stress engineered junction of the latchup SCR by selective epitaxial deposition in the etched area; and removing the mask.

In another aspect, an integrated circuit (IC) device includes a latchup silicon controlled rectifier (SCR); and an electrostatic discharge (ESD) SCR, wherein the ESD SCR has a higher current gain and a lower triggering voltage than the latchup SCR.

In another aspect, a latchup silicon controlled rectifier (SCR) includes a p+ region and an n+ region located in a p-well of the latchup SCR; and a p+ region and an n+ region located in a n-well of the latchup SCR, wherein the latchup SCR further comprises one of embedded silicon germanium (eSiGe) in the p+ region in the n-well of the latchup SCR and silicon carbide (SiC) in the n+ region in the p-well of the latchup SCR.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a method for stress enhanced junction engineering for a latchup SCR, and devices including latchup SCRs with stressed enhanced junctions, are provided, with exemplary embodiments being discussed below in detail. For a latchup SCR, a small current gain (i.e., beta) and relatively high turn-on voltage for the parasitic NPN & PNP junctions is desired. In contrast, for an ESD SCR, a larger beta and lower turn-on voltage for the parasitic NPN & PNP junctions is desired, so that relatively high transient currents may be dissipated by the ESD SCR. Therefore, stressed enhanced junction engineering may be applied to n+ and p+ junctions in latchup SCRs to reduce the beta of the parasitic NPN and PNP structures, which increases the triggering and holding voltage of the latchup SCR structure. The stressed enhanced junctions may comprise embedded silicon germanium (eSiGe) p+ regions and/or silicon carbide (SiC) n+ regions. In ESD SCRs, the stressed enhanced junctions are omitted so as to ensure a relatively high beta and lower turn-on voltage. This selective application of stressed enhanced junctions improves the performance of ICs that include latchup and/or ESD SCRs.

Figure 1A:
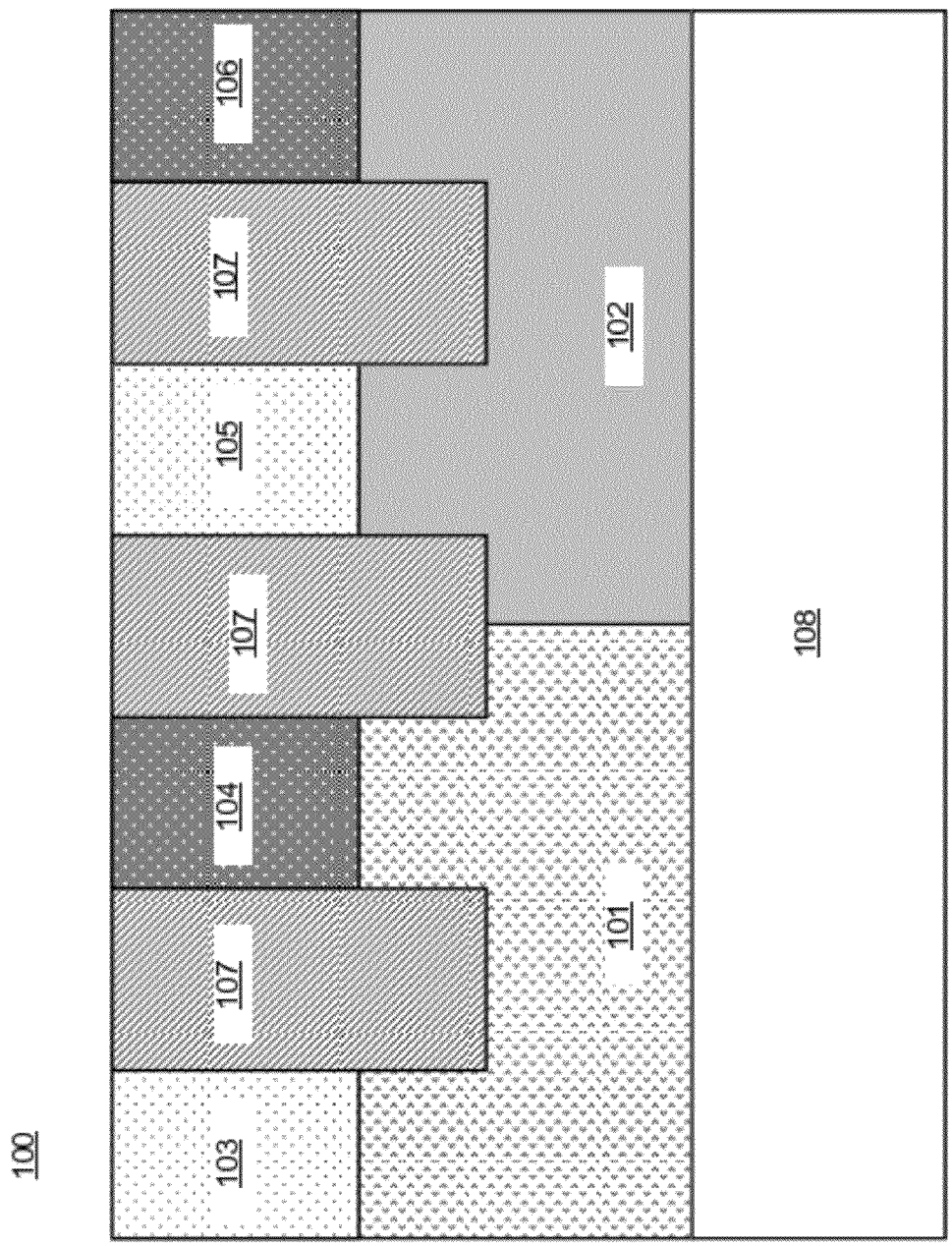
FIG. 1A is a cross sectional view illustrating an embodiment of an SCR.
Figure 1B:
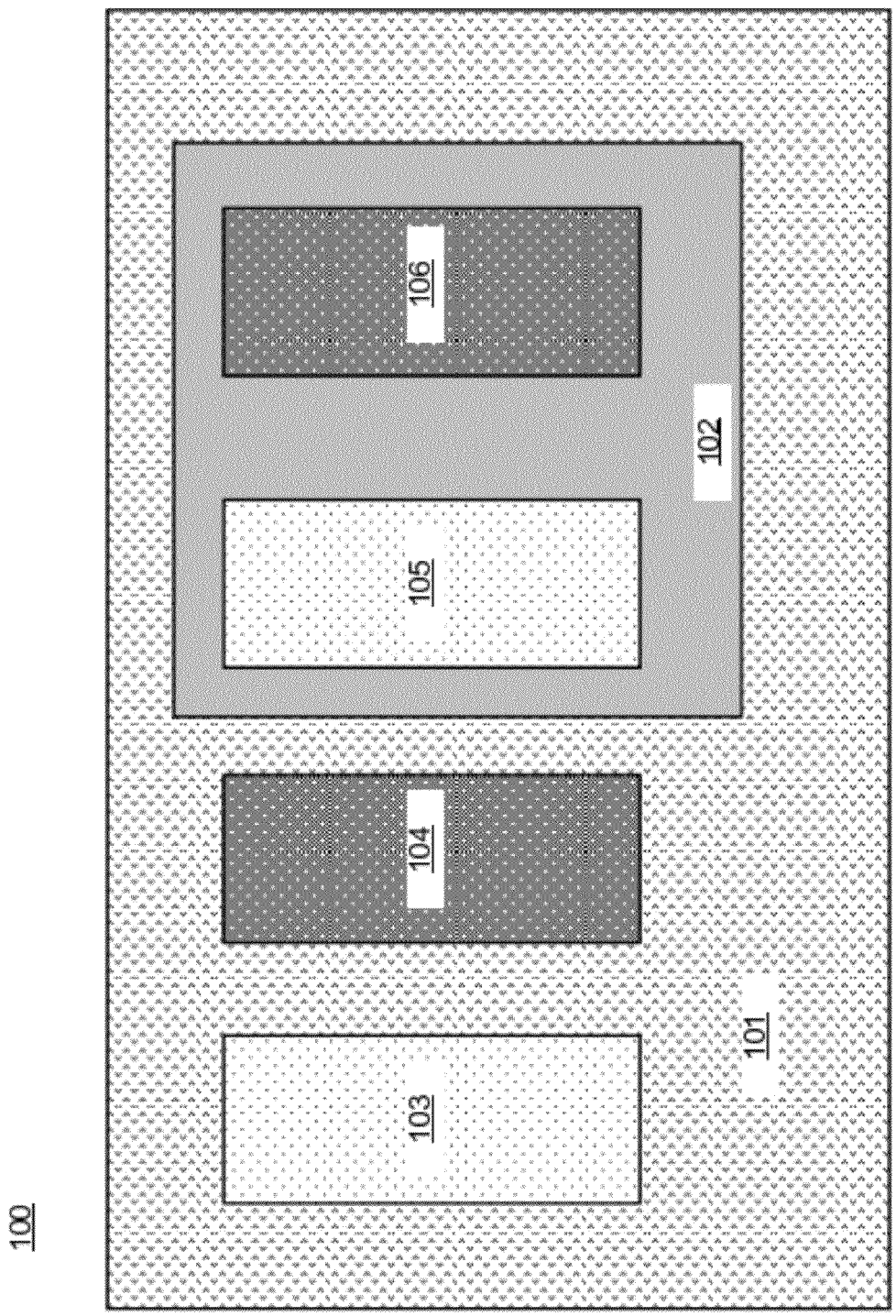
FIG. 1B is a top view of the SCR of FIG. 1A.

FIG. 1 shows a cross-sectional view of an example SCR 100, comprising p-well 101, n-well 102, p+ region 103, n+ region 104, p+ region 105, and n+ region 106. P+ region 103, n+ region 104, p+ region 105, and n+ region 106 are separated by shallow trench isolation (STI) regions 107, and the SCR is formed on a silicon substrate 108. The SCR 100 comprises as two cross-coupled bipolar transistors. The first is an NPN transistor, with n-well 102 acting as the collector, p+ region 103 and p-well region 101 acting as the base, and n+ region 104 acting as the emitter. The second is a PNP transistor with p+ region 105 acting as the emitter, n+ region 106 and n-well region 102 acting as the base, and p-well 101 acting as the collector. FIG. 1B illustrates a top view of the SCR 100 of FIG. 1A. STI regions 107 that were shown in FIG. 1A are omitted in FIG. 1B so as to show the location of the p-well 101 and n-well 102. The NPN junction comprises n-well 102, p+ region 103, and n+ region 104, and the PNP junction comprises p+ region 105, n+ region 106, and p-well 101. The PNP junction comprising p+ region 105, n+ region 106, and p-well 101 turns on in the presence of a transient signal, and collector current of the PNP junction raises the potential of the local p-well 101. When the potential of local p-well 101 reaches a threshold (typically about 0.7 volts), the NPN junction comprising n-well 102, p+ region 103, and n+ region 104 turns on. A sustained turn-on condition then occurs. In embodiments in which SCR 100 comprises a latchup SCR, the sustained turn-on condition is a short circuit that may damage the device that includes the latchup SCR 100. In embodiments in which SCR 100 comprises an ESD SCR, the sustained turn-on condition is dissipates the transient current, preventing damage to the device that includes the ESD SCR 100.

In order to lower the beta and raise the turn-on voltage of a SCR such as SCR 100 that comprises a latchup SCR, enhanced junction engineering may be applied to either or both of n+ region 104 and p+ region 105. SiC may be formed in n+ region 104, and/or eSiGe may be formed in p+ region 105. The latchup triggering voltage of SCR 100 increases with the addition of a p+ eSiGe junction 105 and/or an n+ SiC junction 104; therefore, latchup conditions in SCR 100 may be prevented by the stress enhanced junction engineering. If SCR 100 is an ESD SCR, however, the stress enhanced junction engineering is not applied, so that the beta of the SCR will be higher and the turn-on voltage will be lower, allowing discharge of relatively high currents across the ESD SCR. Latchup SCRs and ESD SCRs may be formed on the same IC; during fabrication of such an IC, stress enhanced junction engineering is only applied to the latchup SCRs.

Figure 2:
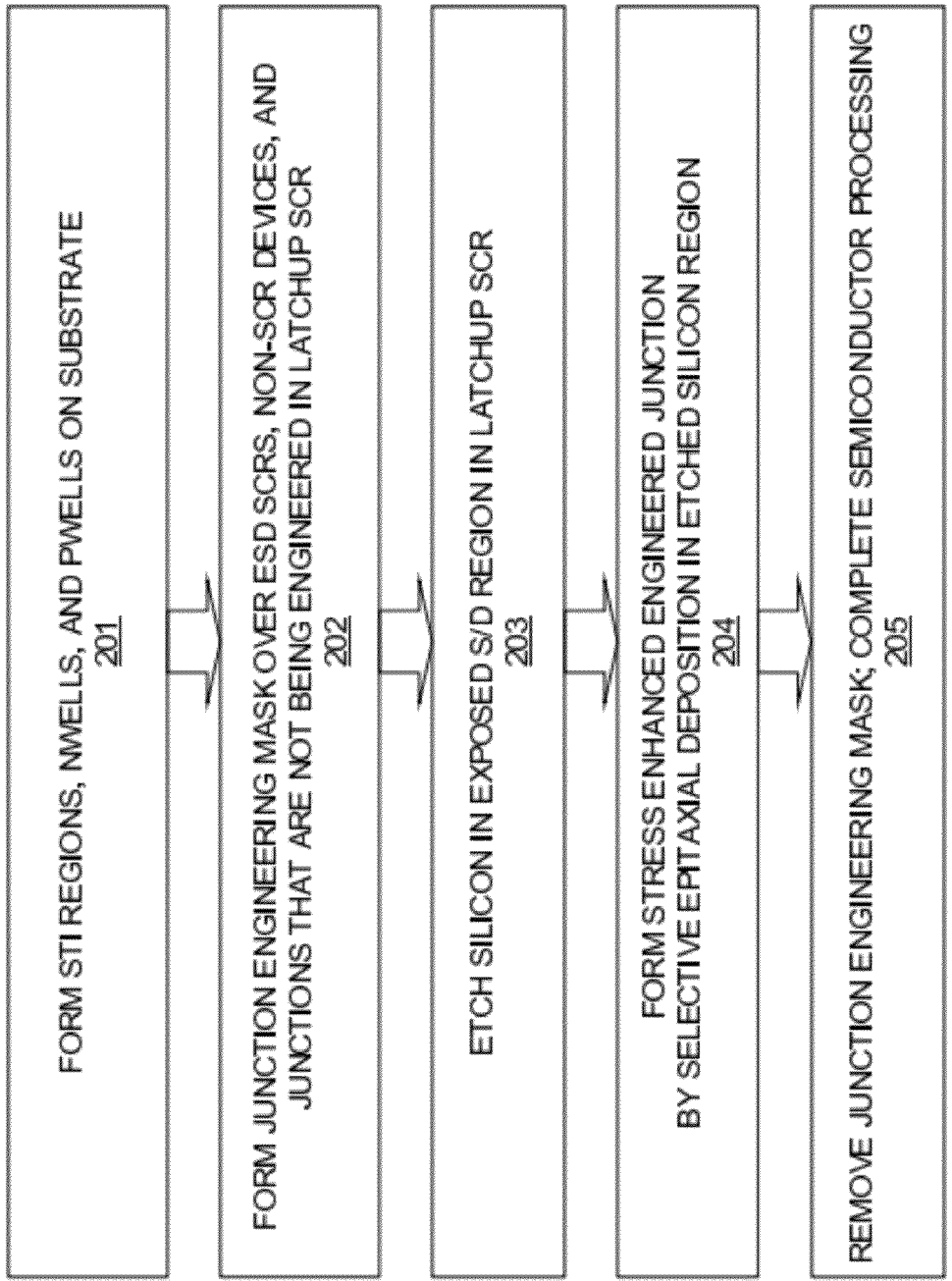
FIG. 2 is a flowchart illustrating a method for stress enhanced junction engineering for a latchup SCR.

FIG. 2 is a flowchart of an embodiment of a method 200 for stress enhanced junction engineering for a latchup SCR. Method 200 may be used to form latchup SCRs on an IC that also contains ESD SCRs, and a SCR formed by method 200 may include SiC in an n+ region, eSiGe in a p+ region, or both, in various embodiments. A first embodiment of method 200, in which eSiGe is formed in a p+ region that is located in the n-well of a latchup SCR on an IC, is discussed with respect to FIGS. 3-8, and a second embodiment of method 200, in which SiC is formed in an n+ region that is located in the p-well of a latchup SCR on an IC, is discussed with respect to FIGS. 3-4 and 9-12. The first and second embodiments of method 200 may both be applied to the same latchup SCR in some embodiments, resulting in a latchup SCR with both a SiC n+ region in the p-well, and an eSiGe p+ region in the n-well. In other embodiments, a latchup SCR may only have an eSiGe p+ region in the n-well, or only have a SiC n+ region in the p-well.

Figure 3:
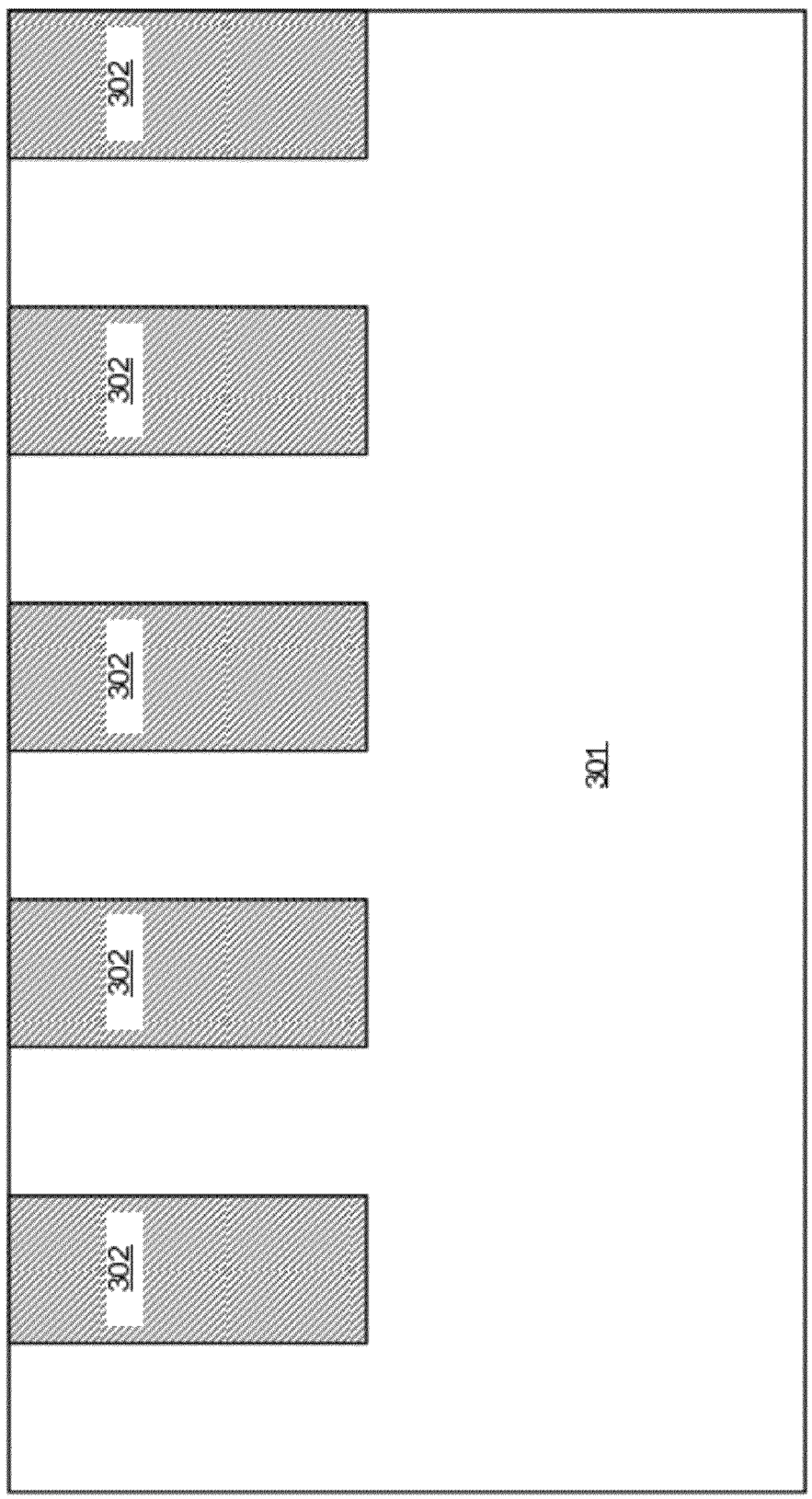
FIG. 3 is a cross sectional view illustrating an embodiment of a substrate with shallow trench isolation regions.
Figure 4:
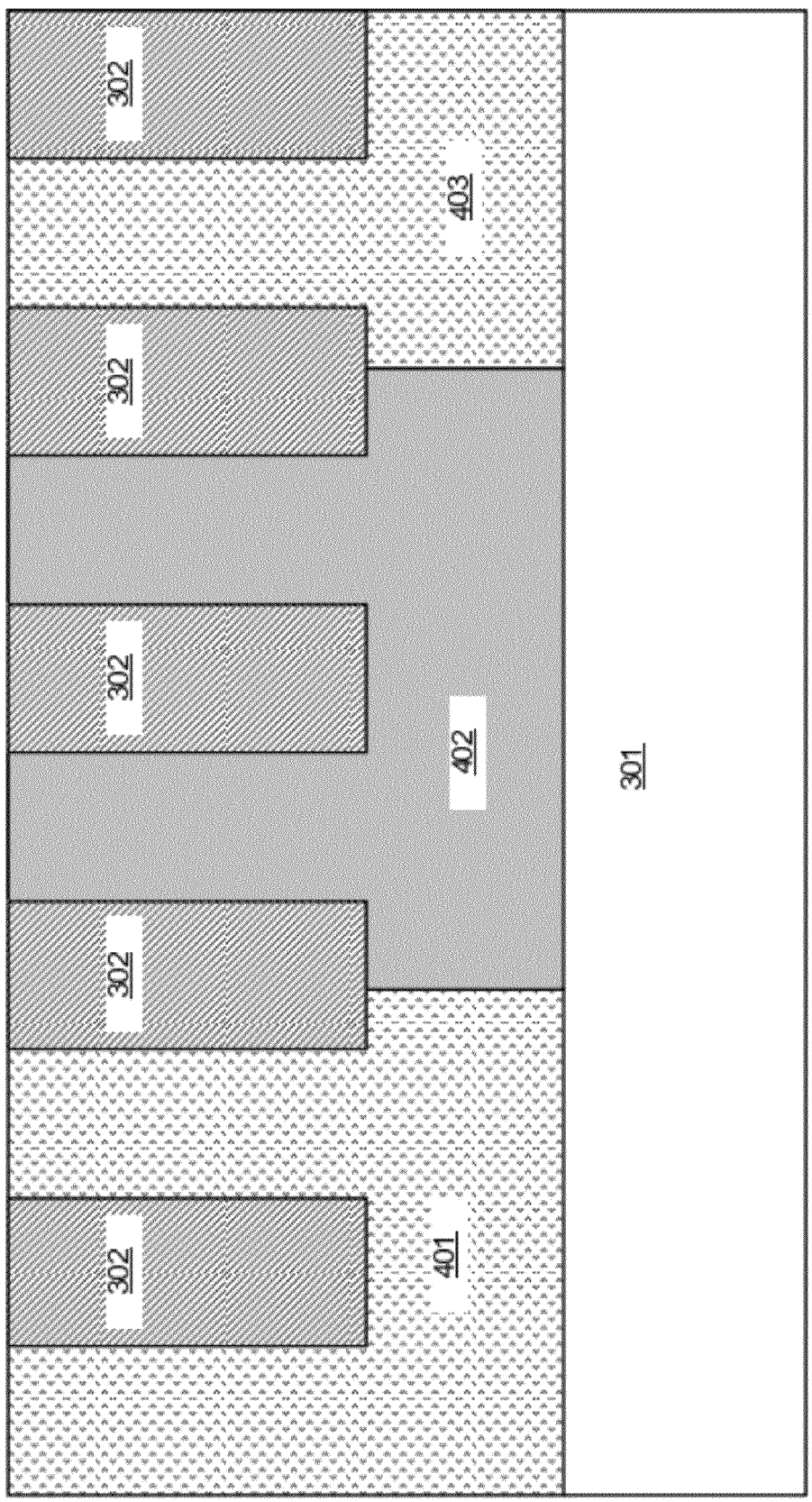
FIG. 4 is a cross sectional view illustrating an embodiment of the device of FIG. 3 after formation of n-wells and p-wells.
Figure 5:
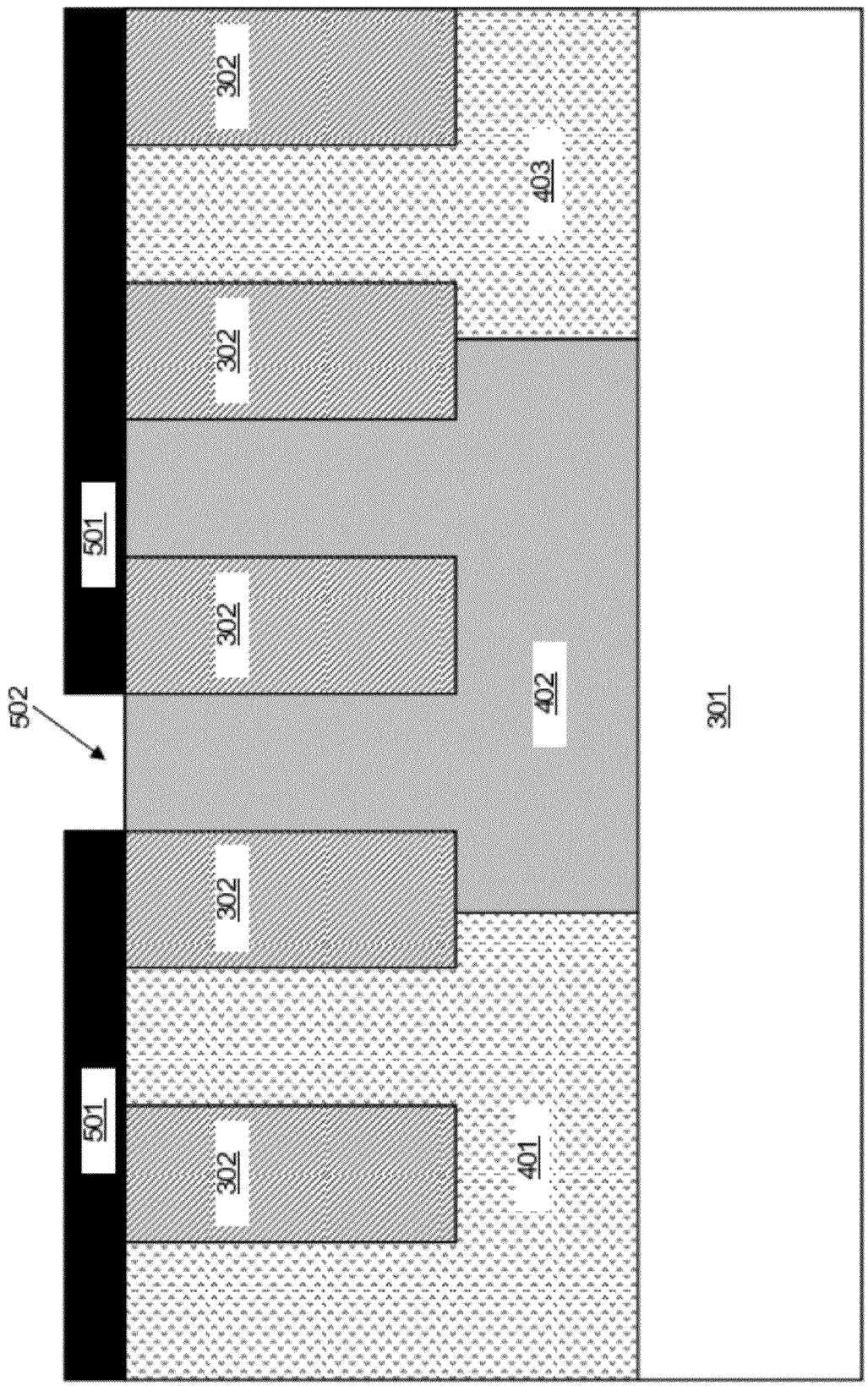
FIG. 5 is a cross sectional view illustrating an embodiment of the device of FIG. 4 after formation of a mask.

A first embodiment of application of method 200, in which a latchup SCR with an eSiGe p+ region in the n-well is formed, begins in block 201 with formation of STI regions, n-wells and p-wells on a substrate. A substrate 301 after formation of STI regions 302 is shown in FIG. 3. Substrate 301 comprises a silicon substrate, and STI regions 302 include a dielectric material such as oxide. Then, n-well 402 and p-wells 401 and 403 are formed in the substrate 301 as is shown in FIG. 4. Formation of n-well 402 and p-wells 401 and 403 may be performed using any appropriate technique, such as implantation of the n-wells and the p-wells with appropriate respective n-type and p-type dopants, followed by a rapid thermal anneal (RTA). Then, in block 202, a junction engineering mask is applied to the IC. The junction engineering mask exposes a p+ region in any latchup SCRs on the IC, so that stressed enhanced junction engineering may be performed in the exposed p+ region. The junction engineering mask covers ESD SCRs, n+ regions, and p+ regions located in the p-well of latchup SCRs, and any other devices on the IC to which stressed enhanced junction engineering is not applied. An embodiment of an IC with a junction engineering mask such as is applied in block 202 of method 200 is shown in FIG. 5. Junction engineering mask 501 exposes area 502, which is where the p+ region in the n-well 402 of the latchup SCR will be located. The areas that will be the n+ regions and the p+ region in the p-well of the latchup SCR, and any other devices on the IC, such as a device including p-well 403, are covered by in the junction engineering mask 501.

Figure 6:
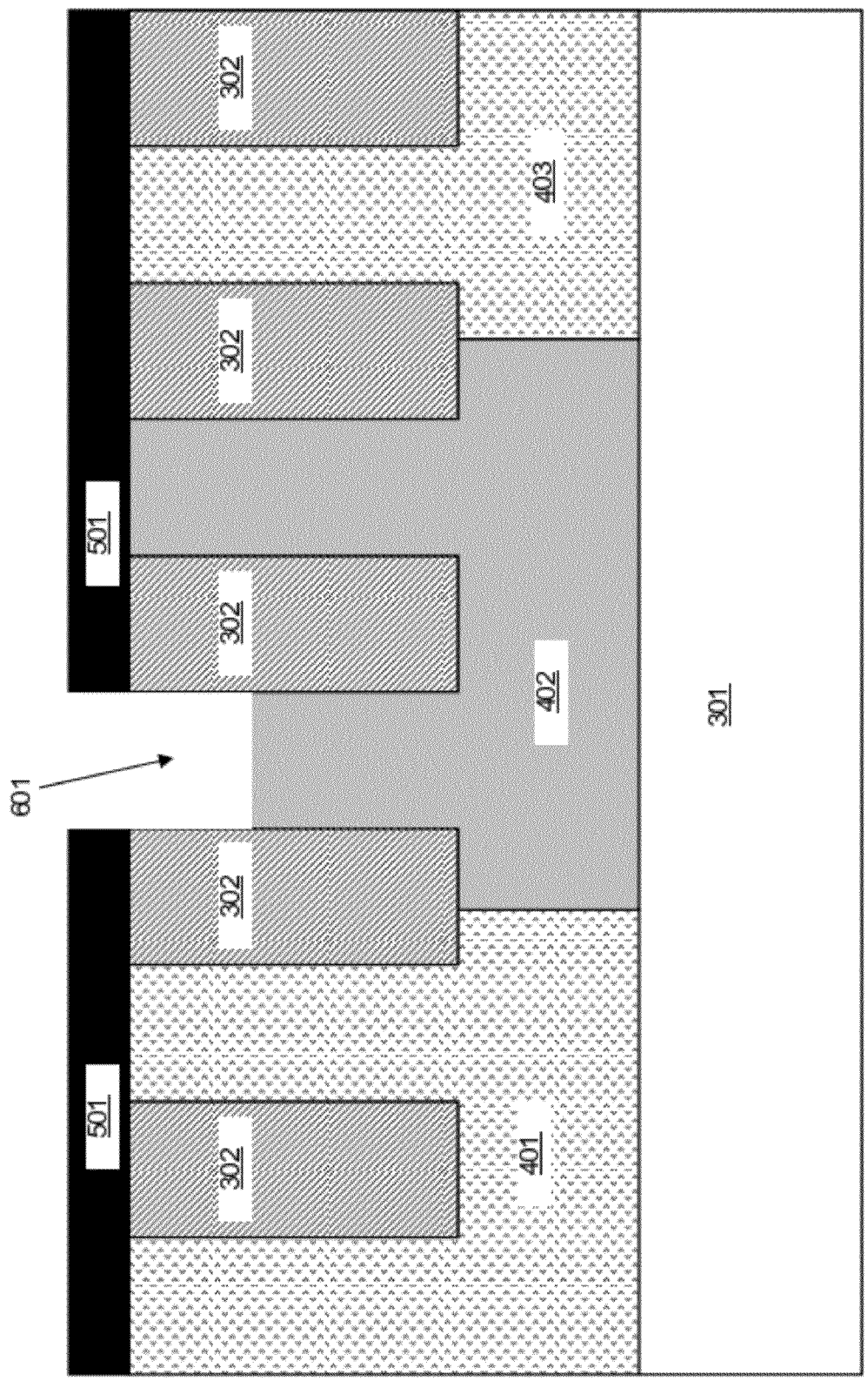
FIG. 6 is a cross sectional view illustrating an embodiment of the device of FIG. 5 after etching.
Figure 7:
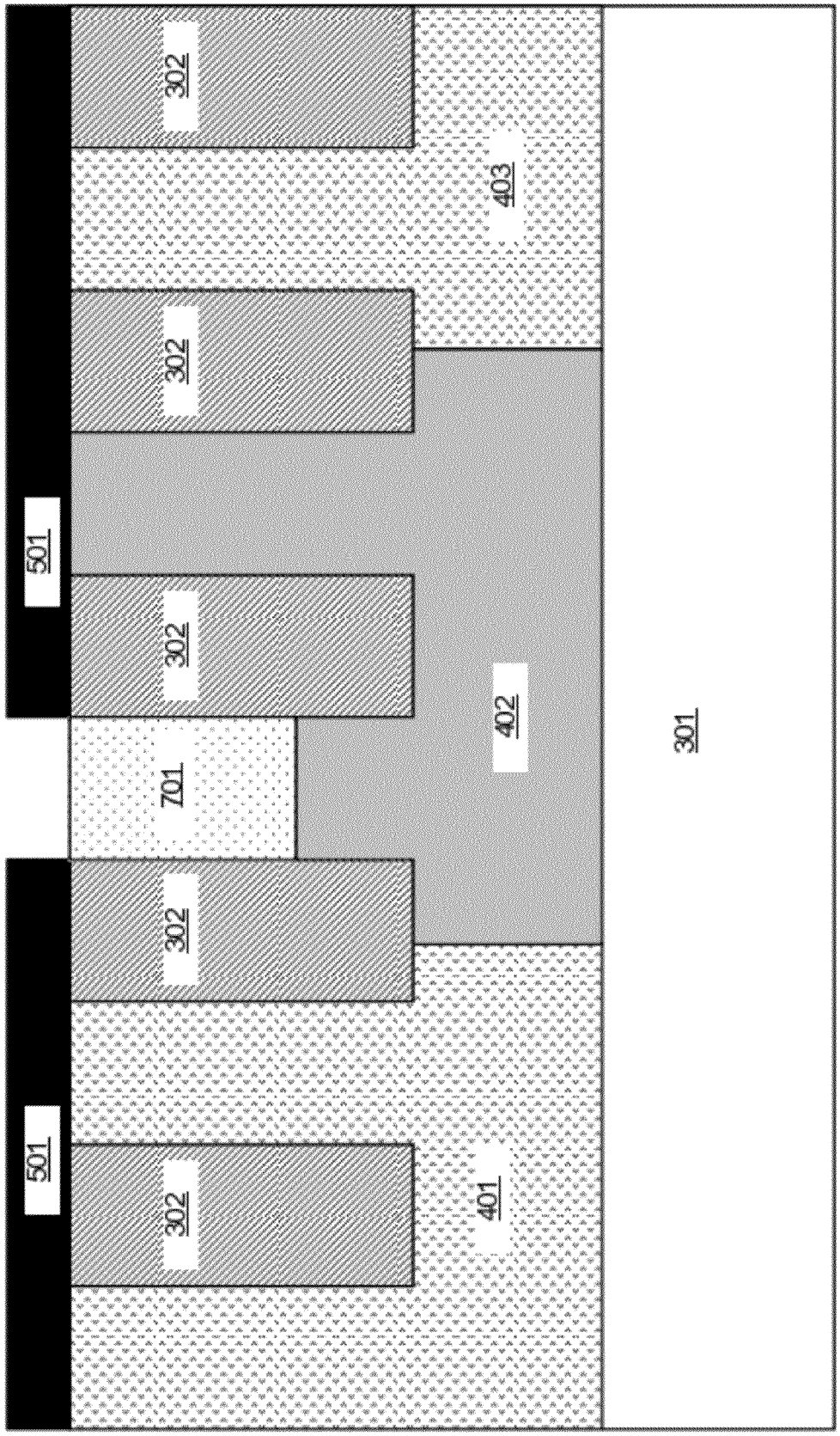
FIG. 7 is a cross sectional view illustrating an embodiment of the device of FIG. 6 after formation of an embedded silicon germanium (eSiGe) junction.
Figure 8:
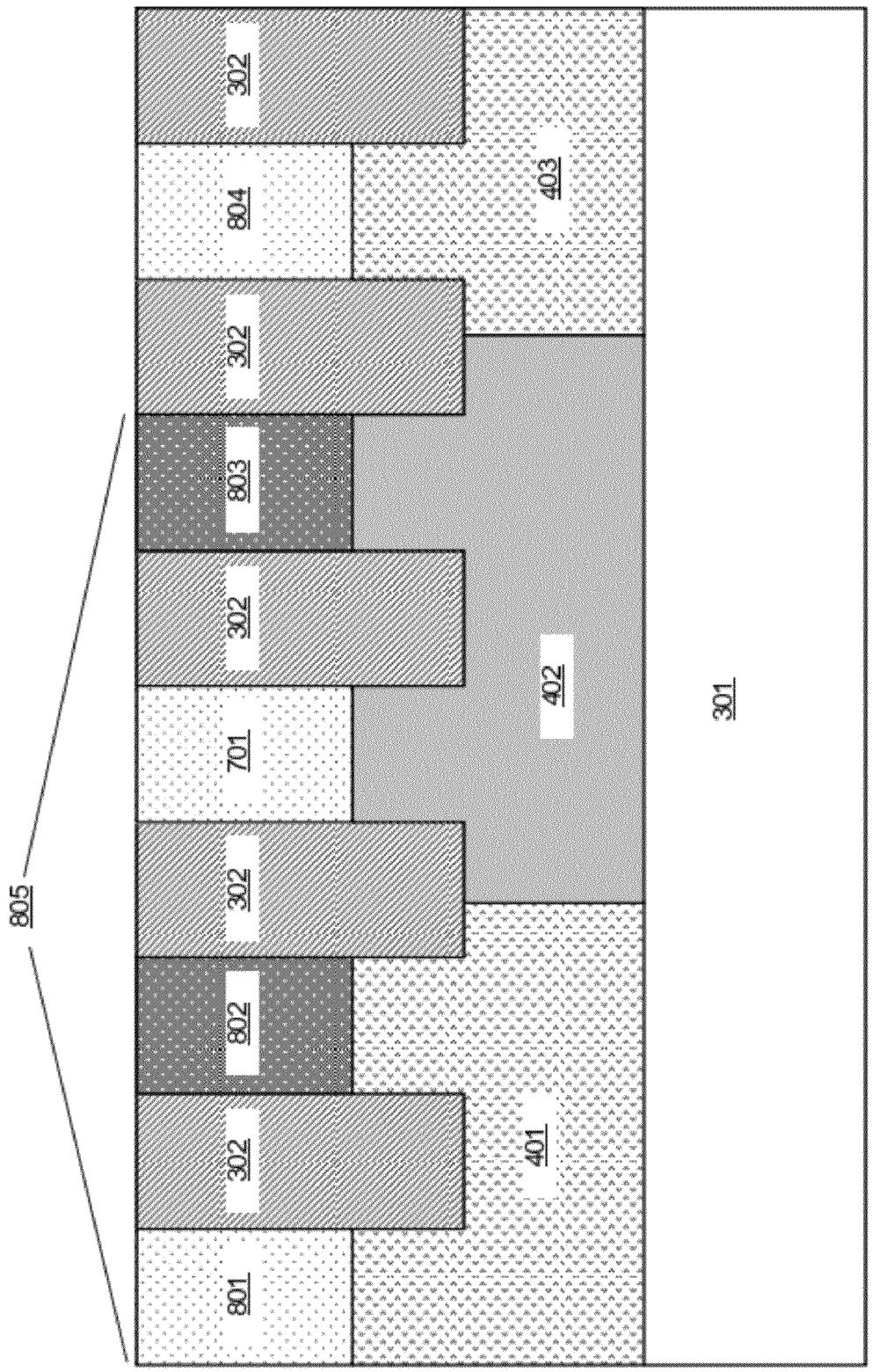
FIG. 8 is a cross sectional view illustrating an embodiment of the device of FIG. 7 after formation of a latchup SCR including an eSiGe junction.

Then, in block 203, the silicon is etched in the exposed area. An embodiment of an etched area 601 is shown in FIG. 6. Etched area 601 is exposed by mask 501. Then, after etching, the stress engineered junction comprising a p+ region of eSiGe is formed in the etched area in block 204 of method 200. The eSiGe is formed by selective epitaxial deposition of germanium and p-type dopants such as boron. The germanium and the p-type dopants mix with the silicon present in the etched area to form the eSiGe p+ region in the n-well. An embodiment of a stress engineered junction comprising eSiGe p+ region 701 in the n-well 402 is shown in FIG. 7. After the eSiGe p+ region is formed in the n-well, flow of method 200 proceeds to block 205, in which the junction engineering mask is removed and IC processing is completed. The other p+ region and n+ regions of the latchup SCRs are formed in block 205, as are any other devices on the IC. The end result is a latchup SCR 805 as is shown in FIG. 8, in which the p+ region 701 in the n-well 402 comprises eSiGe. SCR 805 also includes p+ region 801, n+ region 802, p-well 401, n+ region 803, and n-well 402. P+ region 804 and p-well 403, as shown in FIG. 8, are part of another device in the IC; any appropriate number and type of other devices may be located on the IC that includes SCR 805. The IC on which the latchup SCR 805 is located may also include ESD SCRs that do not comprise eSiGe in the p+ region in the n-well. Latchup SCR 805 may also include SiC in the n+ region 802 in some embodiments.

Figure 9:
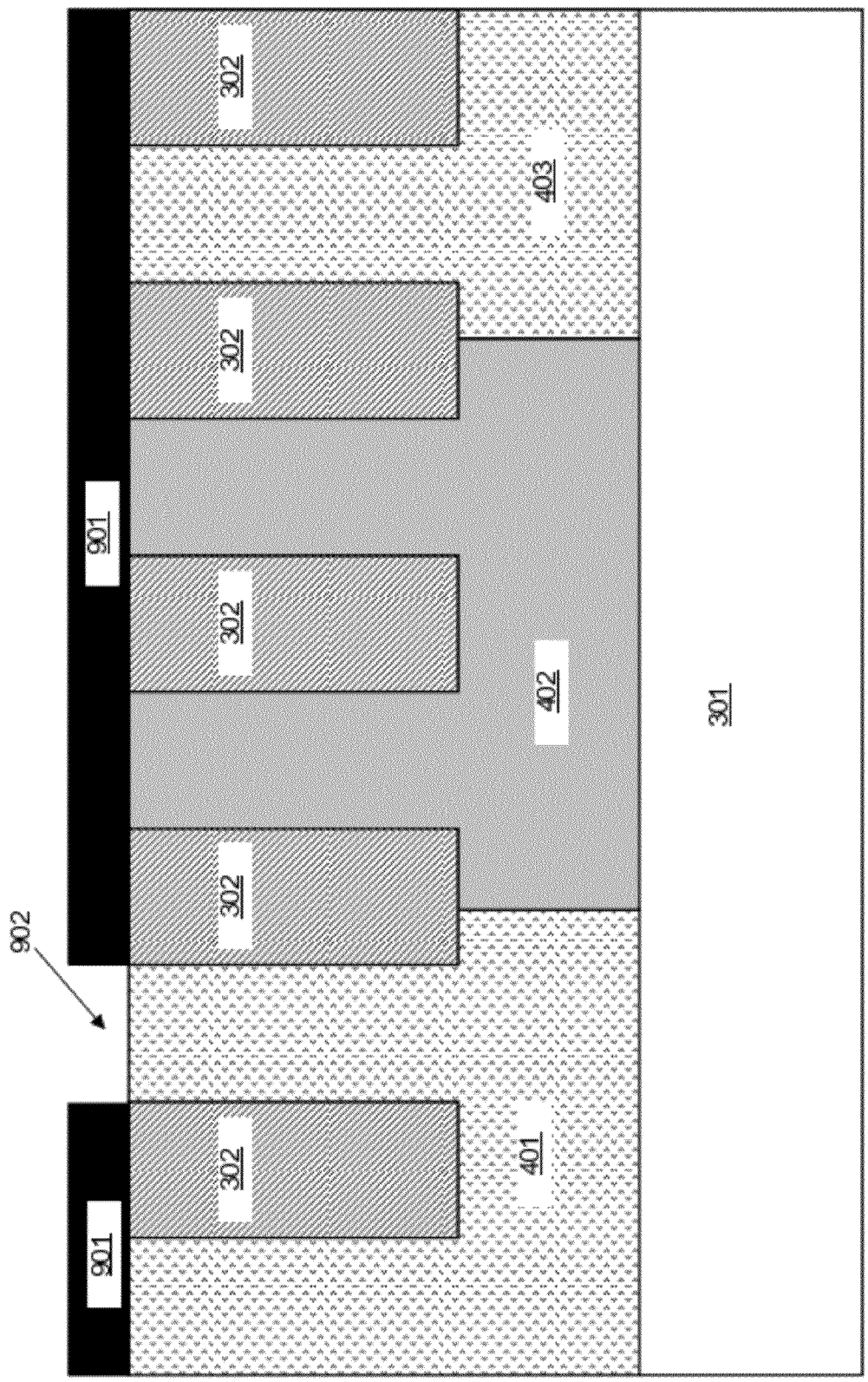
FIG. 9 is a cross sectional view illustrating an embodiment of the device of FIG. 4 after formation of a mask.

A second embodiment of application of method 200, in which a latchup SCR with a SiC n+ region in the p-well is formed, begins in block 201 with formation of STI regions, n-wells and p-wells on a substrate. A substrate 301 after formation of STI regions 302 is shown in FIG. 3. Substrate 301 comprises a silicon substrate, and STI regions 302 include a dielectric material such as oxide. Then, n-well 402 and p-wells 401 and 403 are formed in the substrate 301 as is shown in FIG. 4. Formation of n-well 402 and p-wells 401 and 403 may be performed using any appropriate technique, such as implantation of the n-wells and the p-wells with appropriate respective n-type and p-type dopants, followed by a rapid thermal anneal (RTA). Then, in block 202, a junction engineering mask is applied to the IC. The junction engineering mask exposes an n+ region in any latchup SCRs on the IC, so that stressed enhanced junction engineering may be performed in the exposed n+ region. The junction engineering mask covers ESD SCRs, p+ regions, and n+ regions located in the n-well of latchup SCRs, and any other devices on the IC to which stressed enhanced junction engineering is not applied. An embodiment of an IC with a junction engineering mask such as is applied in block 202 of method 200 is shown in FIG. 9. Junction engineering mask 901 exposes area 902, which is where the n+ region in the p-well 401 of the latchup SCR will be located. The areas that comprise the p+ regions and the n+ region in the n-well of the latchup SCR, and any other devices on the IC, such as a device including p-well 403, are covered by in the junction engineering mask 901.

Figure 10:
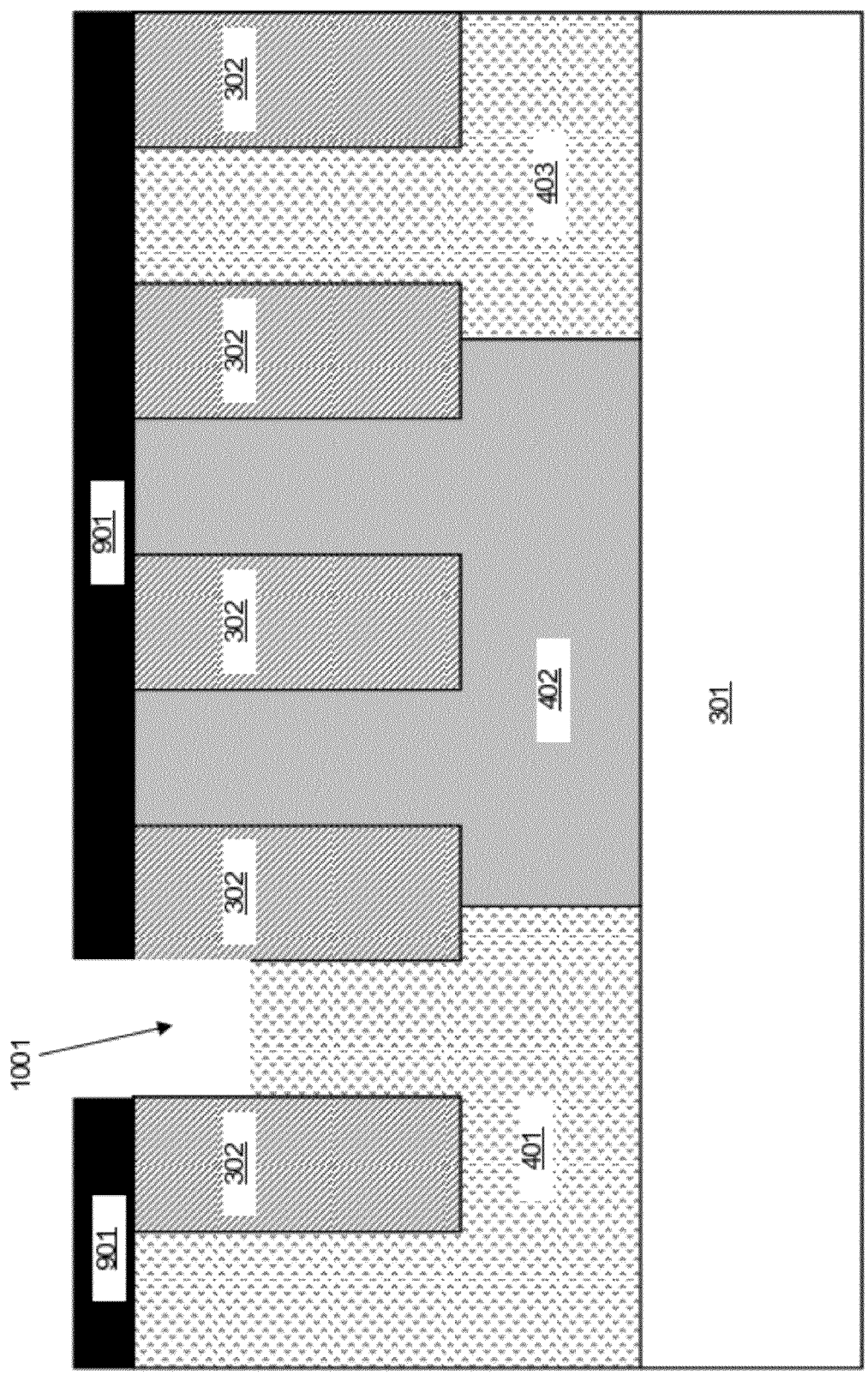
FIG. 10 is a cross sectional view illustrating an embodiment of the device of FIG. 9 after etching.
Figure 11:
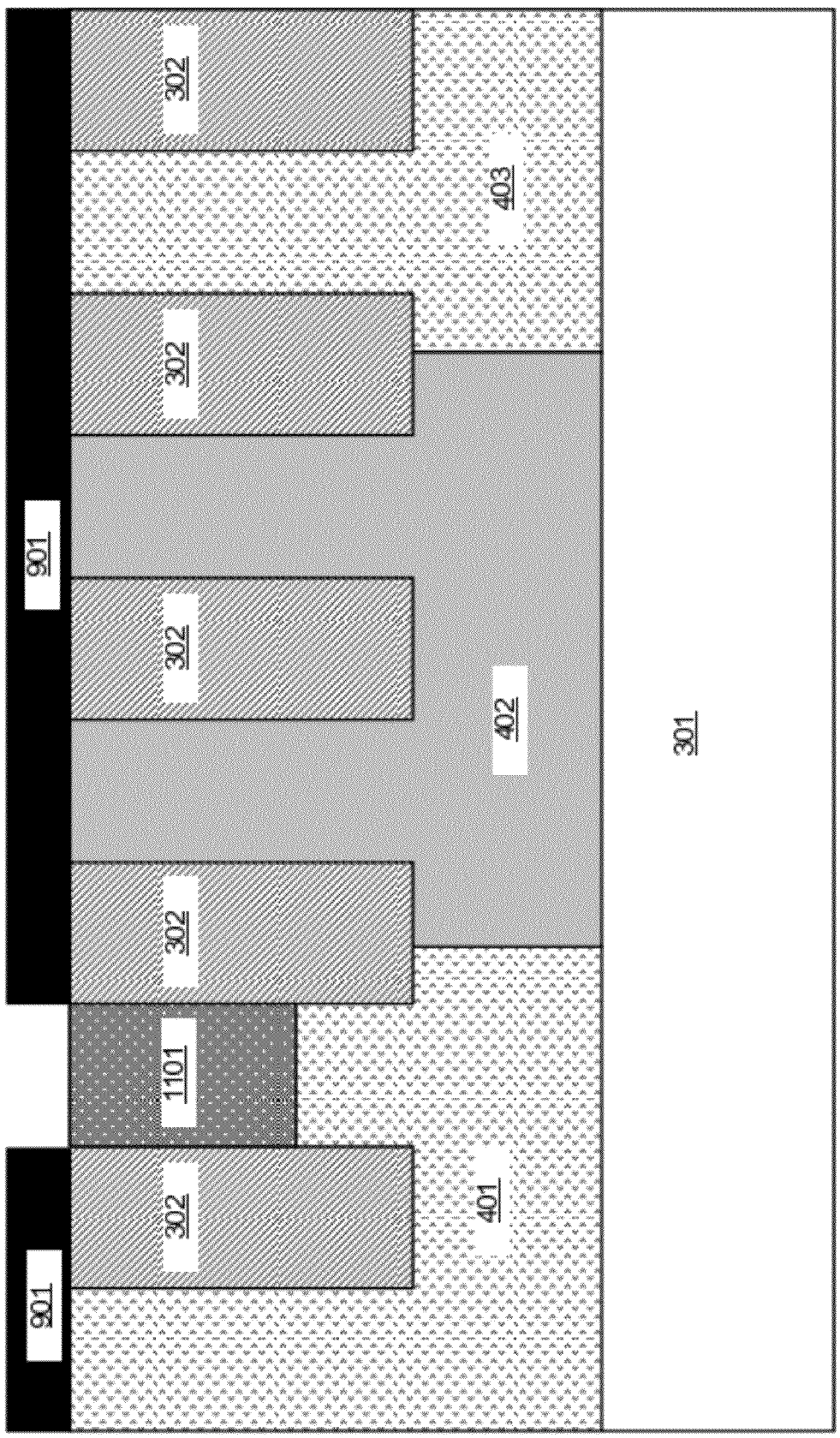
FIG. 11 is a cross sectional view illustrating an embodiment of the device of FIG. 10 after formation of a silicon carbide (SiC) junction.
Figure 12:
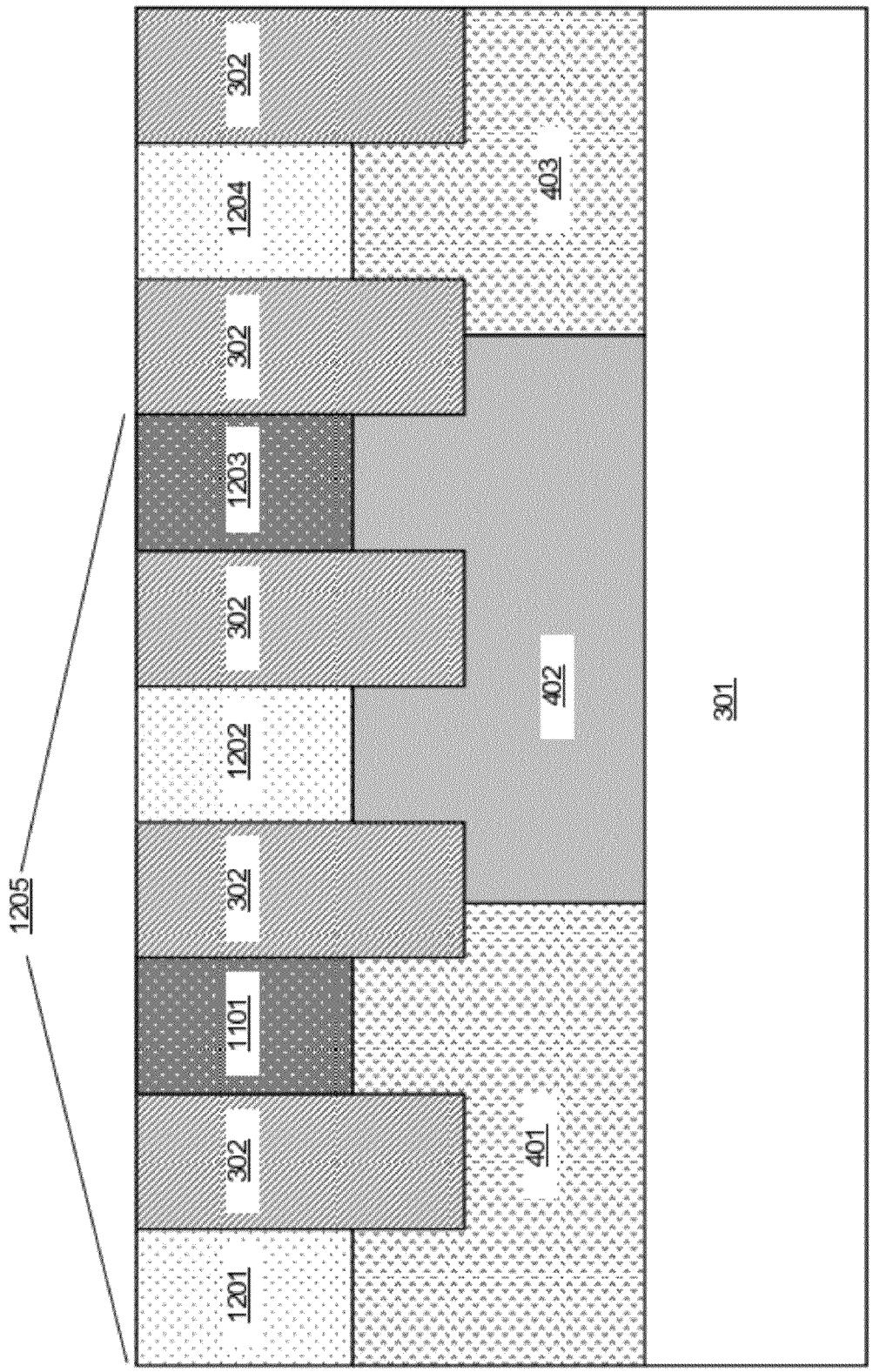
FIG. 12 is a cross sectional view illustrating an embodiment of the device of FIG. 11 after formation of a latchup SCR including a SiC junction.

Then, in block 203, the silicon is etched in the exposed area. An embodiment of an etched area 1001 is shown in FIG. 10. Etched area 1001 is exposed by mask 901. Then, after etching, the stress engineered junction comprising an n+ region of SiC is formed in the etched area in block 204. The SiC is formed by selective epitaxial deposition of carbon and n-type dopants such as phosphorous or arsenic. The carbon and the n-type dopants mix with the silicon present in the etched area to form the SiC n+ region in the p-well. An embodiment of a stress engineered junction comprising SiC n+ region 1101 in the p-well 401 is shown in FIG. 11. After the SiC n+ region is formed in the p-well, flow of method 200 proceeds to block 205, in which the junction engineering mask is removed and IC processing is completed. The other n+ region and p+ regions of the latchup SCRs are formed in block 205, as are any other devices on the IC. The end result is a latchup SCR 1205 as is shown in FIG. 12, in which the n+ region 1101 in the p-well 401 comprises SiC. SCR 1205 also includes p+ region 1201, n+ region 1202, p-well 401, n+ region 1203, and n-well 402. P+ region 1204 and p-well 403, as shown in FIG. 12, are part of another device in the IC; any appropriate number and type of other devices may be located on the IC that includes SCR 1205. The IC on which the latchup SCR 1205 is located may also include ESD SCRs that do not comprise SiC in the n+ region in the p-well. Latchup SCR 1205 may also include eSiGe in the p+ region 1202 in some embodiments.

The technical effects and benefits of exemplary embodiments include a reduced beta for a latchup SCR, and, in some embodiments, a higher beta for an ESD SCR located on the same IC as the latchup SCR.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of forming an IC device including a latchup silicon controlled rectifier (SCR), the method comprising:
    forming a mask on a top surface of a substrate, wherein the mask covers a first portion of the substrate and exposes a second portion of the substrate that is located in one of an n-well and a p-well on the substrate;
    etching the exposed second portion of the substrate to form an etched area;
    forming a stress engineered junction of the latchup SCR by selective epitaxial deposition in the etched area; and
    removing the mask.

2. The method of claim 1, wherein the mask exposes a portion of the substrate that is located in the n-well of the latchup SCR.

3. The method of claim 1, wherein the selective epitaxial deposition comprises germanium and a p-type dopant.

4. The method of claim 3, wherein the p-type dopant comprises boron.

5. The method of claim 1, wherein the stress engineered junction comprises an embedded silicon germanium (eSiGe) p+ region located in the n-well of the latchup SCR.

6. The method of claim 1, wherein the mask exposes a portion of the substrate that is located in the p-well of the latchup SCR.

7. The method of claim 1, wherein the selective epitaxial deposition comprises carbon and an n-type dopant.

8. The method of claim 7, wherein the n-type dopant comprises one of phosphorous and arsenic.

9. The method of claim 1, wherein the stress engineered junction comprises a silicon carbide (SiC) n+ region located in the p-well of the latchup SCR.

10. The method of claim 1, further comprising forming an electrostatic discharge (ESD) SCR in the first portion of the substrate.

11. The method of claim 10, wherein the ESD SCR has a higher current gain and a lower triggering voltage than the latchup SCR.

12. The method of claim 10, wherein the ESD SCR does not comprise silicon germanium or silicon carbide.

13. An integrated circuit (IC) device, comprising:
    a latchup silicon controlled rectifier (SCR); and
    an electrostatic discharge (ESD) SCR, wherein the ESD SCR has a higher current gain and a lower triggering voltage than the latchup SCR.

14. The IC device of claim 13, wherein the latchup SCR comprises embedded silicon germanium (eSiGe) in a p+ region located in an n-well of the latchup SCR.

15. The IC device of claim 13, wherein the ESD SCR does not comprise SiGe in a p+ region located in an n-well of the ESD SCR.

16. The IC device of claim 13, wherein the latchup SCR comprises silicon carbide (SiC) in an n+ region located in a p-well of the latchup SCR.

17. The IC device of claim 13, wherein the ESD SCR does not comprise SiC in an n+ region located in a p-well of the ESD SCR.

18. The IC device of claim 13, wherein the wherein the latchup SCR comprises embedded silicon germanium (eSiGe) in a p+ region located in an n-well of the latchup SCR and silicon carbide (SiC) in an n+ region located in an p-well of the latchup SCR.

19. A latchup silicon controlled rectifier (SCR), comprising:
- a p+ region and an n+ region located in a p-well of the latchup SCR; and
- a p+ region and an n+ region located in a n-well of the latchup SCR, wherein the latchup SCR further comprises one of embedded silicon germanium (eSiGe) in the p+ region in the n-well of the latchup SCR and silicon carbide (SiC) in the n+ region in the p-well of the latchup SCR.

20. The latchup SCR of claim 19, wherein the latchup SCR comprises both of eSiGe in the p+ region in the n-well of the latchup SCR and SiC in the n+ region in the p-well of the latchup SCR.

* * * * *